US012629782B2

(12) United States Patent
Mizutani et al.

(10) Patent No.: US 12,629,782 B2
(45) Date of Patent: May 19, 2026

(54) WAFER PROCESSING METHOD

(71) Applicant: DISCO CORPORATION, Tokyo (JP)

(72) Inventors: Akira Mizutani, Tokyo (JP); Kai Minamizaki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 388 days.

(21) Appl. No.: 18/406,706

(22) Filed: Jan. 8, 2024

(65) Prior Publication Data

US 2024/0253164 A1     Aug. 1, 2024

(30) Foreign Application Priority Data

Jan. 30, 2023     (JP) ................................. 2023-012136

(51) Int. Cl.
| | |
|---|---|
| *B23K 26/53* | (2014.01) |
| *B23K 101/40* | (2006.01) |
| *H10P 34/42* | (2026.01) |
| *H10P 52/00* | (2026.01) |
| *H10W 72/00* | (2026.01) |

(52) U.S. Cl.
CPC .............. *B23K 26/53* (2015.10); *H10P 34/42* (2026.01); *H10P 52/00* (2026.01); *B23K 2101/40* (2018.08); *H10W 72/0198* (2026.01)

(58) Field of Classification Search
CPC ....... B23K 26/53; H10P 34/42; H01L 21/268; H01L 21/304
See application file for complete search history.

(56) References Cited

U.S. PATENT DOCUMENTS

| | | | | |
|---|---|---|---|---|
| 8,546,725 | B2 * | 10/2013 | Ramsayer .......... | B23K 26/0665 |
| | | | | 219/121.75 |
| 11,450,523 | B2 * | 9/2022 | Tanoue ............... | H10P 72/0606 |

FOREIGN PATENT DOCUMENTS

| | | |
|---|---|---|
| JP | 2007158239 A | 6/2007 |
| JP | 2020057709 A | 4/2020 |

* cited by examiner

*Primary Examiner* — Dale E Page
*Assistant Examiner* — Wilner Jean Baptiste
(74) *Attorney, Agent, or Firm* — Greer Burns & Crain Ltd.

(57)     ABSTRACT

A wafer processing method includes bonding a front surface of a first wafer to a second wafer, applying a laser beam along positions on the inner side other than a peripheral edge of the first wafer by a predetermined distance to form an annular first modified layer and a first crack exposed on the front surface side, thereby generating a warpage in a peripheral region of the first wafer, applying a laser beam to the peripheral region to form a plurality of annular second modified layers and a plurality of second cracks exposed on the front surface side, thereby generating a warpage in the peripheral region, and grinding the first wafer from a back surface side to thin the first wafer to a finished thickness. The bonding of the first wafer and the second wafer to each other is canceled by the warpages in the peripheral region.

4 Claims, 9 Drawing Sheets

WAFER PROCESSING METHOD

BACKGROUND OF THE INVENTION

Field of the Invention

The present invention relates to a wafer processing method.

Description of the Related Art

Attendant on the trend of device chips toward a reduced height and a higher degree of integration in recent years, developments of three-dimensionally bonded wafers have been under progress. For example, in the case of a through-silicon via (TSV) wafer, through electrodes have enabled connection between electrodes of two chips by lamination of the two chips with each other.

Such a wafer is thinned by grinding in the state of being bonded with a support wafer (silicon, glass, ceramic, or the like) serving as a base. Since a wafer normally has its peripheral edge chamfered, when the wafer is ground to an extremely small thickness, the peripheral edge becomes what is generally called a knife edge, so that chipping of the edge is liable to occur during grinding. As a result, chipping may extend to the devices, possibly leading to breakage of the devices.

As a countermeasure against the knife edge, what is generally called an edge trimming technology in which the peripheral edge on the front surface side of a wafer is cut in an annular shape has been developed (see Japanese Patent No. 4895594). In addition, an edge trimming method in which, after lamination of wafers, a laser beam is applied along the peripheral edge of the devices to form an annular modified layer, whereby the edge chipping of the wafers generated during grinding is restrained from stretching to the devices has also been devised (see Japanese Patent Laid-open No. 2020-057709).

SUMMARY OF THE INVENTION

However, the method described in Japanese Patent No. 4895594 has a problem that chipping which reaches the devices is generated during cutting, possibly leading to breakage of the devices; in addition, since a large amount of swarf is generated, the devices are liable to be contaminated with contaminants. Besides, the method described in Japanese Patent Laid-open No. 2020-057709 has a problem that, in a case where the modified layer is formed on the inner side than the bonding region, offcuts of a peripheral surplus region to be removed may not be peeled off during grinding and left.

Accordingly, it is an object of the present invention to provide a wafer processing method by which, in a step of grinding a bonded wafer, a peripheral surplus region can be removed while breakage of devices is restrained.

In accordance with an aspect of the present invention, there is provided a wafer processing method including a bonded wafer forming step of bonding a front surface side of a first wafer that is formed on the front surface side with a plurality of devices and that has its peripheral edge chamfered to a second wafer to form a bonded wafer, a first modified layer forming step of, after the bonded wafer forming step is carried out, applying a laser beam having a wavelength transmittable through the first wafer, from a back surface side of the first wafer in an annular pattern along positions on an inner side than the peripheral edge by a predetermined distance to form in an inside of the first wafer an annular first modified layer and a first crack that extends from the first modified layer and that is exposed on the front surface side of the first wafer, thereby generating a warpage in a peripheral region on a peripheral edge side of the first modified layer and the first crack, a second modified layer forming step of, after the bonded wafer forming step is carried out, applying the laser beam having the wavelength transmittable through the first wafer, to the peripheral region in an annular pattern, to form in the inside of the first wafer a plurality of annular second modified layers and a plurality of second cracks that extend from the second modified layers and that are exposed on the front surface side of the first wafer, thereby generating a warpage in the peripheral region, and a grinding step of, after the first modified layer forming step and the second modified layer forming step are carried out, grinding the first wafer of the bonded wafer from the back surface side to thin the first wafer to a finished thickness. The bonding of the first wafer and the second wafer to each other is canceled by the warpages generated in the peripheral region in the first modified layer forming step and the second modified layer forming step.

In accordance with another aspect of the present invention, there is provided a wafer processing method including a bonded wafer forming step of bonding a front surface side of a first wafer that is formed on the front surface side with a plurality of devices and that has its peripheral edge chamfered to a second wafer to form a bonded wafer, a first modified layer forming step of, after the bonded wafer forming step is carried out, applying a laser beam having a wavelength transmittable through the first wafer, from a back surface side of the first wafer in an annular pattern along positions on an inner side than the peripheral edge by a predetermined distance to form in an inside of the first wafer an annular first modified layer and a first crack that extends from the first modified layer and that is exposed on the front surface side of the first wafer, thereby generating a warpage in a peripheral region on a peripheral edge side of the first modified layer and the first crack, a second modified layer forming step of, after the bonded wafer forming step is carried out, applying the laser beam having the wavelength transmittable through the first wafer, to the peripheral region along a first direction parallel to the front surface of the first wafer, to form in the inside of the first wafer a plurality of second modified layers and a plurality of second cracks that extend from the second modified layers and that are exposed on the front surface side of the first wafer, thereby generating a warpage in the peripheral region, and a grinding step of, after the first modified layer forming step and the second modified layer forming step are carried out, grinding the first wafer of the bonded wafer from the back surface side to thin the first wafer to a finished thickness. The bonding of the first wafer and the second wafer to each other is canceled by the warpages generated in the peripheral region in the first modified layer forming step and the second modified layer forming step.

Preferably, the wafer processing method of the present invention further includes a third modified layer forming step of, after the second modified layer forming step is carried out but before the grinding step is carried out, applying the laser beam having the wavelength transmittable through the first wafer, to the peripheral region along a second direction that is parallel to the front surface of the first wafer and that intersects the first direction, to form in the inside of the first wafer a plurality of third modified layers and a plurality of third cracks that extend from the third modified layers and that are exposed on the front surface side of the first wafer, thereby enlarging the warpage generated in the peripheral region in the second layer forming step. The bonding of the first wafer and the second wafer to each other is canceled by the warpages generated in the peripheral region in the first modified layer forming step, the second modified layer forming step, and the third modified layer forming step.

Preferably, the first direction and the second direction intersect each other at an angle greater than 0 degrees but smaller than 90 degrees.

According to the present invention, in the step of grinding the bonded wafer, the peripheral surplus region can be removed while breakage of devices is restrained.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not to be limited by the contents described in the following embodiment. In addition, the constituent elements described below include those which can easily be conceived of by a person skilled in the art and those which are substantially the same. Further, the configurations described below can be combined with one another as required. Besides, various omissions, replacements, or modifications of the configurations are possible within such ranges as not to depart from the gist of the present invention.

Figure 1:
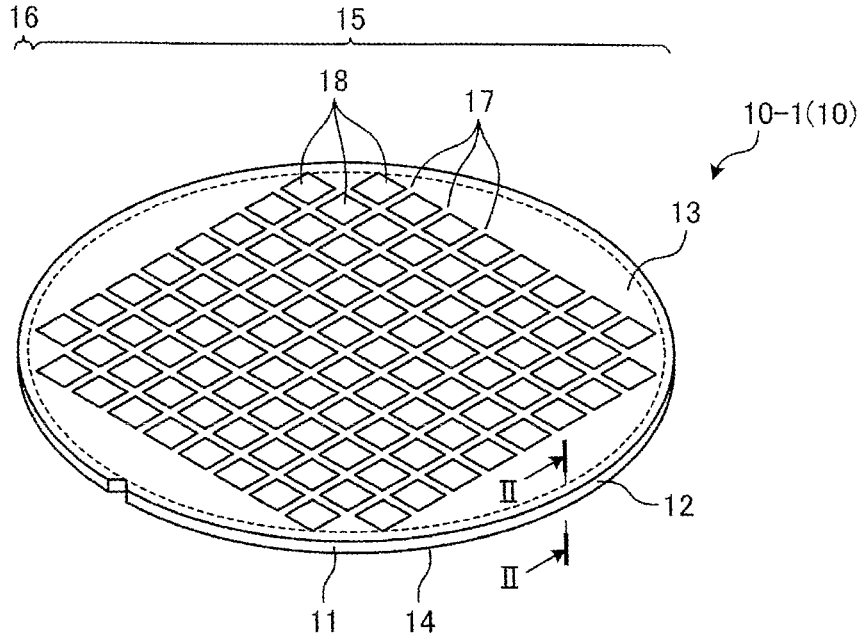
FIG. 1 is a perspective view depicting an example of a wafer to be processed by a wafer processing method according to an embodiment.
Figure 2:
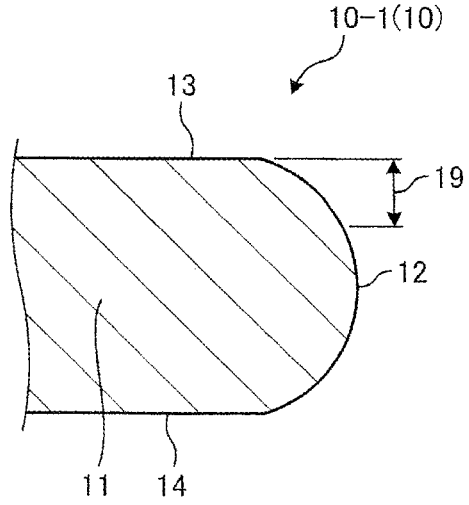
FIG. 2 is a cross-sectional view taken along line II-II of FIG. 1.

A processing method for a wafer 10 according to an embodiment of the present invention will be described with reference to the drawings. FIG. 1 is a perspective view depicting an example of the wafer 10 to be processed by the processing method for the wafer 10 according to the embodiment. FIG. 2 is a cross-sectional view taken along line II-II of FIG. 1.

The wafer 10 depicted in FIGS. 1 and 2 is a wafer such as a disk-shaped semiconductor wafer or optical device wafer having a substrate 11 formed of silicon (Si), sapphire (Al$_2$O$_3$), gallium arsenide (GaAs), silicon carbide (SiC), or the like, and, in the embodiment, the wafer 10 is a silicon wafer. As depicted in FIG. 2, the wafer 10 has its peripheral edge 12 chamfered such that the center in the thickness direction projects to the most peripheral side and a section ranging from a front surface 13 to a back surface 14 of the substrate 11 is arcuate.

As depicted in FIG. 1, the wafer 10 has a device layer including a central region 15 and a peripheral region 16 surrounding the central region 15, on the front surface 13 side of the substrate 11. The central region 15 has a plurality of projected dicing lines (streets) 17 set in a grid pattern on the front surface 13 of the substrate 11 and devices 18 formed respectively in the regions partitioned by the streets 17. The peripheral region 16 is a region which surrounds the central region 15 over the whole circumference and in which the devices 18 are not formed.

The device 18, in the embodiment, constitutes a three-dimensional (3D) NAND flash memory, and includes an electrode pad and through electrodes connected to the electrode pad. The through electrode penetrates the substrate 11 to the back surface 14 side of the substrate 11 when the substrate 11 is thinned and the devices 18 are individually divided from the wafer 10. In other words, the wafer 10 in the embodiment is what is generally called a TSV wafer in which the individually divided devices 18 have through electrodes. Note that the wafer 10 of the present invention is not limited to the TSV wafer having the through electrodes as in the embodiment, and may be a device wafer having no through electrode.

Figure 3:
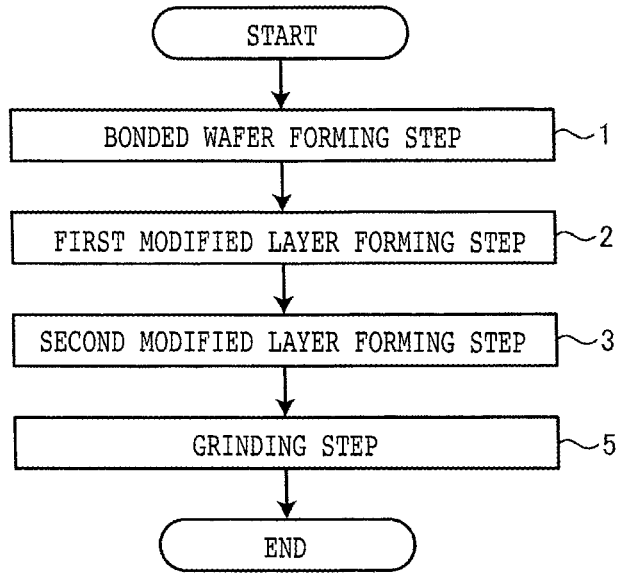
FIG. 3 is a flow chart depicting the flow of the wafer processing method according to the embodiment.

FIG. 3 is a flow chart depicting the flow of the processing method for the wafer 10 according to the embodiment. As depicted in FIG. 3, the processing method for the wafer 10 according to the embodiment includes a bonded wafer forming step 1, a first modified layer forming step 2, a second modified layer forming step 3, and a grinding step 5. The processing method for the wafer 10 according to the embodiment is a method of bonding the front surface 13 side of the wafer 10 on one side (a first wafer 10-1) to the wafer 10 on the other side (a second wafer 10-2) to thereby laminate the wafers 10 and thinning the wafer 10 on one side (the first wafer 10-1) to a predetermined finished thickness 19.

Note that, in the following description, in the case of distinguishing the wafers 10 of the pair of wafers 10 from each other, the wafer 10 on one side will be referred to as the first wafer 10-1 while the wafer 10 on the other side will be referred to as the second wafer 10-2 (see FIG. 4), and in the case of not distinguishing the wafers 10, the wafer 10 will simply be referred to as the wafer 10. The second wafer 10-2 which is not thinned is described as being a TSV wafer similarly to the first wafer 10-1 in the embodiment, but the second wafer 10-2 in the present invention may be a simple substrate wafer which does not have a pattern.

Bonded Wafer Forming Step 1

Figure 4:
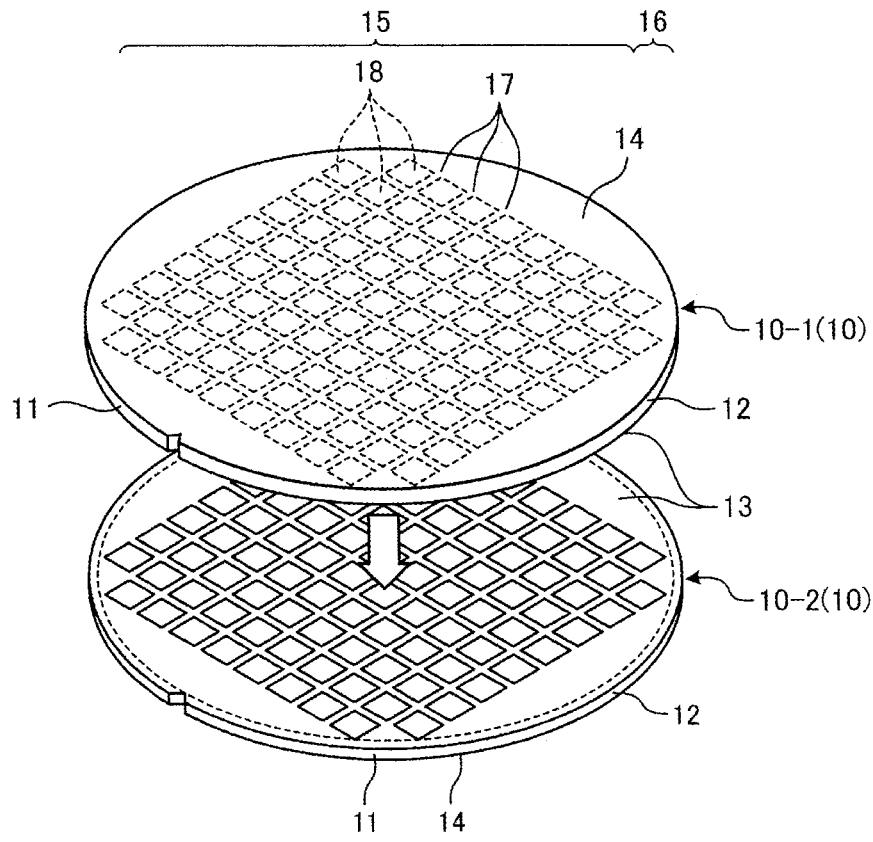
FIG. 4 is a perspective view depicting one state in a bonded wafer forming step depicted in FIG. 3.

FIG. 4 is a perspective view depicting one state in the bonded wafer forming step 1 depicted in FIG. 3. The bonded wafer forming step 1 is a step of bonding the front surface 13 side of the first wafer 10-1 to the second wafer 10-2 to thereby form a bonded wafer 20.

In the bonded wafer forming step 1, first, the front surface 13 of the first wafer 10-1 and the front surface 13 of the second wafer 10-2 are caused to face each other with an interval therebetween. Next, the front surface 13 of the first wafer 10-1 and the front surface 13 of the second wafer 10-2 are bonded with each other. As a result, the bonded wafer 20 is formed. Note that the front surface 13 side of the first wafer 10-1 and the front surface 13 side of the second wafer 10-2 are bonded with each other but, in a case where the second wafer 10-2 is a substrate wafer, any surface side of the second wafer 10-2 may be bonded.

First Modified Layer Forming Step 2

Figure 5:
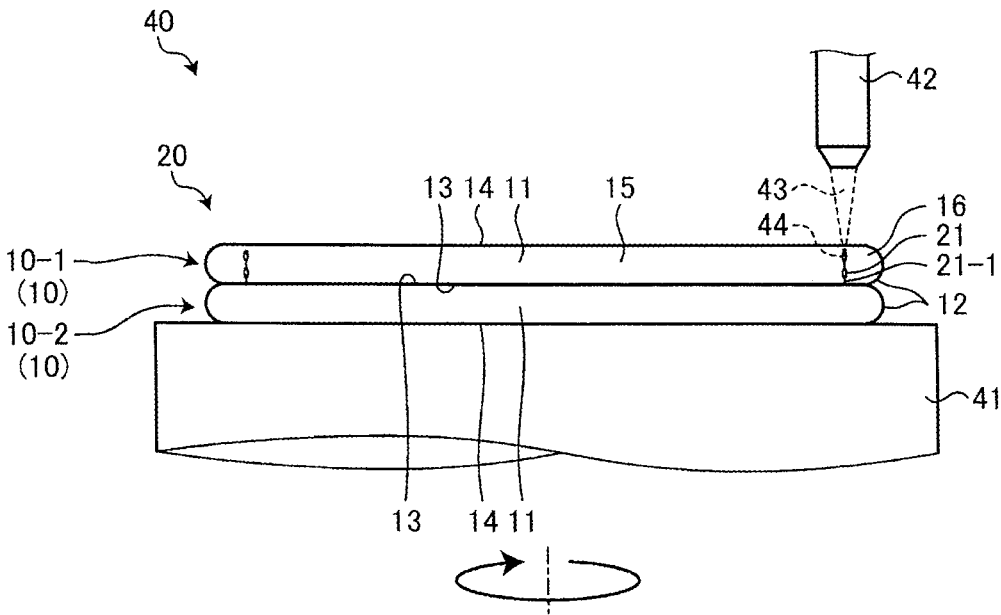
FIG. 5 is a side view depicting, partly in cross-section, one state in a first modified layer forming step depicted in FIG. 3.
Figure 6:
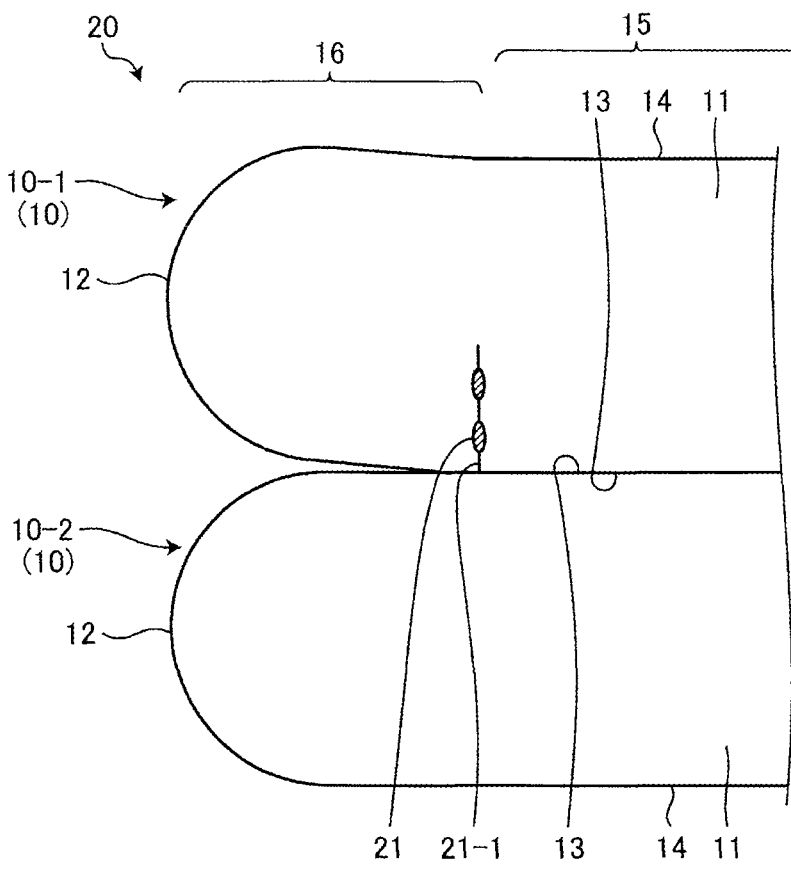
FIG. 6 is a cross-sectional view depicting, in an enlarged form, a part of a bonded wafer that has been subjected to the first modified layer forming step depicted in FIG. 3.

FIG. 5 is a side view depicting, partly in cross-section, one state in the first modified layer forming step 2 depicted in FIG. 3. FIG. 6 is a cross-sectional view depicting, in an enlarged form, a part of the bonded wafer 20 that has been subjected to the first modified layer forming step 2 depicted in FIG. 3. The first modified layer forming step 2 is carried out after the bonded wafer forming step 1 is conducted. The first modified layer forming step 2 is a step of forming an annular first modified layer 21 and a first crack 21-1 exposed on the front surface 13 side, along positions on the inner side than a peripheral edge 12 of the first wafer 10-1 by a predetermined distance, to thereby generate a warpage in the peripheral region 16.

In the first modified layer forming step 2, the first modified layer 21 and the first crack 21-1 are formed in the inside of the first wafer 10-1 by stealth dicing conducted by a laser processing apparatus 40. The laser processing apparatus 40 includes a holding table 41 and a laser beam applying unit 42. The holding table 41 holds the wafer 10 on a holding surface, and is rotatable around a vertical rotational axis. The laser beam applying unit 42 applies a laser beam 43 to the wafer 10 (the first wafer 10-1) held by the holding table 41. The laser processing apparatus 40 further includes an unillustrated moving unit that moves the holding table 41 and the laser beam applying unit 42 relative to each other, an unillustrated imaging unit that images the wafer 10 held by the holding table 41, and the like.

In the first modified layer forming step 2, the laser beam 43 is applied along positions on the inner side than the peripheral edge 12 of the first wafer 10-1 by a predetermined distance from the back surface 14 side of the first wafer 10-1, to thereby form the annular first modified layer 21 in the inside of the first wafer 10-1. The positions on the inner side than the peripheral edge 12 by the predetermined distance are, specifically, the boundary between the central region 15 and the peripheral region 16. The laser beam 43 is a laser beam having a wavelength transmittable through the first wafer 10-1, and is, for example, infrared rays (IR).

The modified layer refers to a region of which density, refractive index, mechanical strength, or other physical properties have been put into the state of being different from those of the surroundings by irradiation with the laser beam 43. The modified layer is, for example, a melting treatment region, a cracked region, a dielectric breakdown region, a refractive index change region, a region in which these regions are mixedly present, or the like. The modified layer (the first modified layer 21) is lower than the other parts of the first wafer 10-1 in mechanical strength or the like.

In the first modified layer forming step 2, first, the back surface 14 side of the second wafer 10-2 is held under suction on the holding surface (upper surface) of the holding table 41. Next, alignment of the first wafer 10-1 and a light concentrator of the laser beam applying unit 42 is performed. Specifically, the holding table 41 is moved into an irradiation region on the lower side of the laser beam applying unit 42 by the unillustrated moving unit. Next, the first wafer 10-1 is imaged by the unillustrated imaging unit to perform alignment, whereby an applying section of the laser beam applying unit 42 is made to vertically face a position on the inner side than the peripheral edge 12 of the first wafer 10-1 by a predetermined distance, after which a focal point 44 of the laser beam 43 is set in the inside of the first wafer 10-1.

In the first modified layer forming step 2, next, while the holding table 41 is being rotated around the vertical rotational axis, the laser beam 43 is applied by the laser beam applying unit 42 from the back surface 14 side of the first wafer 10-1. In other words, the laser beam 43 is applied along positions on the inner side than the peripheral edge 12 of the first wafer 10-1 by the predetermined distance, to thereby form the annular first modified layer 21.

In this instance, the first crack 21-1 extends from the first modified layer 21. In the first modified layer forming step 2, the first modified layer 21 formed by irradiation with the laser beam 43 is formed in such a manner that the first crack 21-1 extending from the first modified layer 21 is exposed on the front surface 13 side of the first wafer 10-1. Note that the first crack 21-1 may be exposed not only on the front surface 13 side of the first wafer 10-1 but also on the back surface 14 side.

As depicted in FIG. 6, by being formed with the first modified layer 21 and the first crack 21-1, the first wafer 10-1 is given a warpage in which the front surface 13 side is projected in the peripheral region 16 on the peripheral edge 12 side of the first modified layer 21 and the first crack 21-1. When the first wafer 10-1 has been formed with the first modified layer 21 and the first crack 21-1 in an annular shape along the whole circumference of the first wafer 10-1, the first modified layer forming step 2 is finished.

Second Modified Layer Forming Step 3

Figure 7:
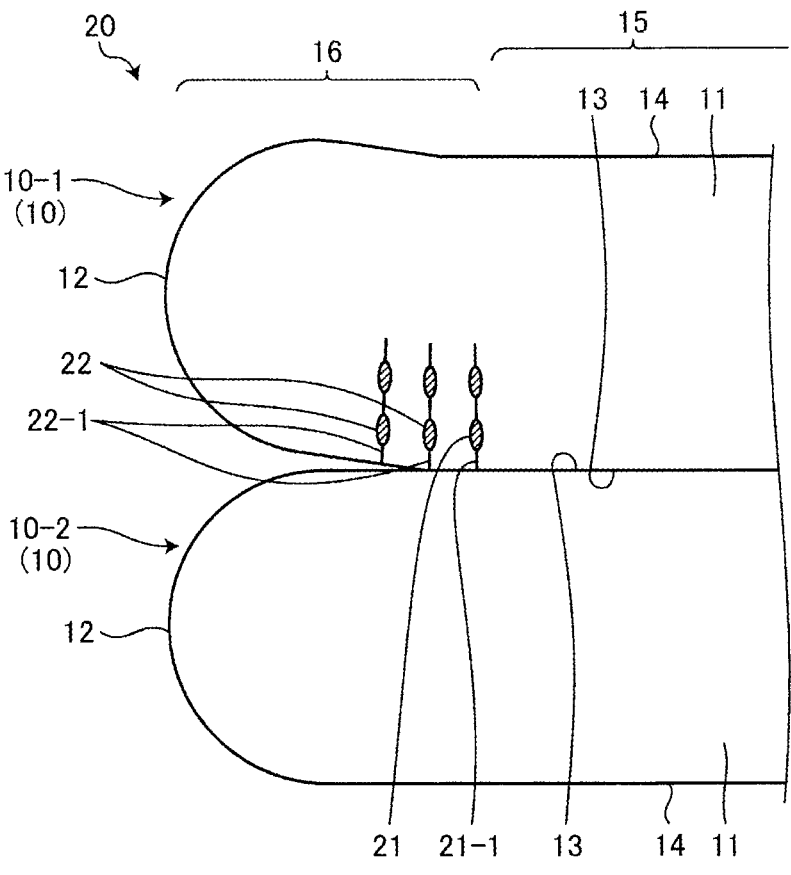
FIG. 7 is a cross-sectional view depicting, in an enlarged form, a part of the bonded wafer that has been subjected to a second modified layer forming step depicted in FIG. 3.
Figure 8:
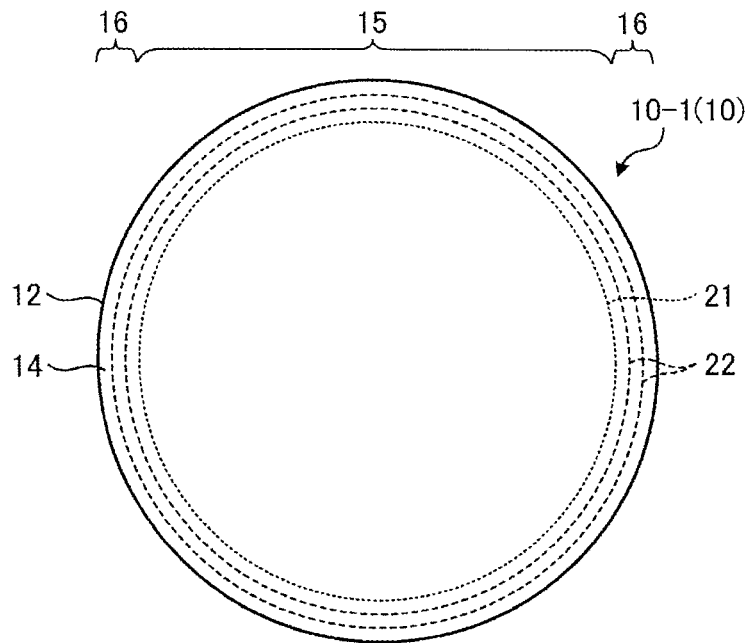
FIG. 8 is a plan view depicting the bonded wafer that has been subjected to the second modified layer forming step depicted in FIG. 3.

FIG. 7 is a cross-sectional view depicting, in an enlarged form, a part of the bonded wafer 20 that has been subjected to the second modified layer forming step 3 depicted in FIG. 3. FIG. 8 is a plan view depicting the bonded wafer 20 that has been subjected to the second modified layer forming step 3 depicted in FIG. 3. The second modified layer forming step 3 is carried out after the bonded wafer forming step 1 is performed. The second modified layer forming step 3 may be carried out before or after the first modified layer forming step 2 is conducted, or the two modified layer forming steps may be alternately carried out part by part. The second modified layer forming step 3 is a step of forming a plurality of annular second modified layers 22 and a plurality of second cracks 22-1 exposed on the front surface 13 side in the peripheral region 16 of the first wafer 10-1, to thereby generate a warpage in the peripheral region 16.

In the second modified layer forming step 3, the plurality of the second modified layers 22 and the plurality of the second cracks 22-1 are formed in the inside of the first wafer 10-1 by stealth dicing conducted by the laser processing apparatus 40. In the second modified layer forming step 3, the laser beam 43 is applied along positions on the inner side than the peripheral edge 12 by a predetermined distance in the peripheral region 16 of the first wafer 10-1, from the back surface 14 side of the first wafer 10-1, whereby the annular second modified layer 22 concentric with the first modified layer 21 is formed in the inside of the first wafer 10-1. The laser beam 43 is the laser beam having the wavelength transmittable through the first wafer 10-1, and processing conditions thereof may be the same as or different from those in the first modified layer forming step 2.

In a case where alignment of the first wafer 10-1 and the laser beam applying unit 42 has been carried out in the first modified layer forming step 2 before starting the second modified layer forming step 3, the alignment may be omitted in the second modified layer forming step 3. In the second modified layer forming step 3, the applying section of the laser beam applying unit 42 is made to vertically face a predetermined position in the peripheral region 16 of the first wafer 10-1, after which the focal point 44 of the laser beam 43 is set in the inside of the first wafer 10-1.

In the second modified layer forming step 3, next, while the holding table 41 is being rotated around the vertical rotational axis, the laser beam 43 is applied by the laser beam applying unit 42 from the back surface 14 side of the first wafer 10-1. In other words, the laser beam 43 is applied in annular patterns concentric with the first modified layer 21, whereby the second modified layers 22 are formed.

In this instance, the second cracks 22-1 extend from the second modified layers 22. In the second modified layer forming step 3, the second modified layers 22 formed by irradiation with the laser beam 43 are formed in such a manner that the second cracks 22-1 extending from the second modified layers 22 are exposed on the front surface 13 side of the first wafer 10-1. Note that the second cracks 22-1 may be exposed not only on the front surface 13 side of the first wafer 10-1 but also on the back surface 14 side.

As depicted in FIG. 7, by being formed with the second modified layers 22 and the second cracks 22-1, the first wafer 10-1 is given a warpage in which the front surface 13 side is projected in the peripheral region 16, or the warpage is enlarged as compared to the state in which the first modified layer 21 and the first crack 21-1 have been formed.

When the first wafer 10-1 has been formed with the second modified layer 22 and the second crack 22-1 in the annular patterns along the whole circumference of the first wafer 10-1, the position of the focal point 44 of the laser beam 43 is moved by a predetermined distance in the radial direction of the first wafer 10-1 within the peripheral region 16, and, similarly, the annular second modified layer 22 and the second crack 22-1 are formed. When the plurality of the second modified layers 22 and the plurality of second cracks 22-1 have been formed in the radial direction as depicted in FIG. 8, the second modified layer forming step 3 is finished.

As depicted in FIG. 7, by the warpages generated in peripheral region 16 by the first modified layer forming step 2 and the second modified layer forming step 3, the bonding of the first wafer 10-1 and the second wafer 10-2 to each other is canceled. Note that the part where the bonding is canceled by the warpages is not limited to the interface between the device layer on the front surface 13 side of the first wafer 10-1 and the device layer on the front surface 13 side of the second wafer 10-2, and the bonding may be canceled at the interface between the substrate 11 and the device layer of the first wafer 10-1 or at the interface between the substrate 11 and the device layer of the second wafer 10-2.

In addition, in the first modified layer forming step 2 and the second modified layer forming step 3, the laser beam 43 may be applied a plurality of times by changing the height of the focal point 44 of the laser beam 43, or the laser beam 43 having a plurality of focal points 44 separate from one another in the thickness direction of the first wafer 10-1 may be applied, to thereby form a plurality of the first modified layers 21 and a plurality of the second modified layers 22 overlapping with one another in the thickness direction of the first wafer 10-1.

Grinding Step 5

Figure 9:
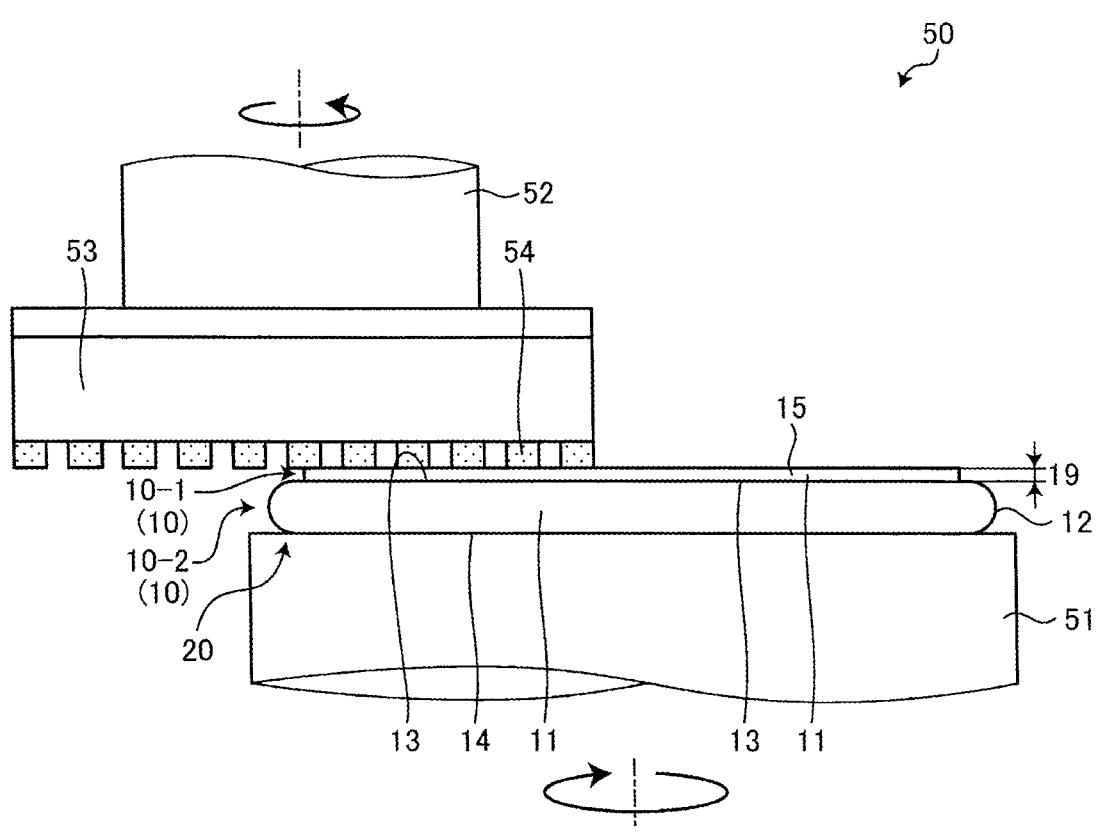
FIG. 9 is a side view depicting, partly in cross-section, one state in a grinding step depicted in FIG. 3.

FIG. 9 is a side view depicting, partly in cross-section, one state in the grinding step 5 depicted in FIG. 3. The grinding step 5 is carried out after the first modified layer forming step 2 and the second modified layer forming step 3 are performed. The grinding step 5 is a step of grinding the first wafer 10-1 of the bonded wafer 20 from the back surface 14 side to thin the first wafer 10-1 to the finished thickness 19.

In the grinding step 5 in the embodiment, the back surface 14 side of the first wafer 10-1 is ground by a grinding apparatus 50 to thereby thin the first wafer 10-1 to the predetermined finished thickness 19 (see FIG. 2). The grinding apparatus 50 includes a holding table 51, a spindle 52 which is a rotary shaft member, a grinding wheel 53 attached to a lower end of the spindle 52, grindstones 54 mounted to a lower surface of the grinding wheel 53, and an unillustrated grinding liquid supply unit. The grinding wheel 53 is rotated around a rotational axis parallel to an axis of the holding table 51.

In the grinding step 5, first, the back surface 14 side of the second wafer 10-2 is held under suction on a holding surface of the holding table 51. Next, in a state in which the holding table 51 is rotated around the rotational axis, the grinding wheel 53 is rotated around a rotational axis. A grinding liquid is supplied to a processing point by the unillustrated grinding liquid supply unit, and the grindstones 54 of the grinding wheel 53 are brought closer to the holding table 51 at a predetermined feeding speed, whereby the back surface 14 of the first wafer 10-1 is ground by the grindstones 54 to thin the first wafer 10-1 to the predetermined finished thickness 19.

In this instance, by an external force with which the grindstones 54 press a to-be-ground surface of the first wafer 10-1, offcuts of the peripheral region 16 of the first wafer 10-1 are removed with the first modified layer 21 and the first crack 21-1 as an interface and with the first modified layer 21 as a starting point.

First Modification

The modified layer formed in the peripheral region 16 on the peripheral edge 12 side of the first modified layer 21 is not limited to the mode of the second modified layer 22 in the embodiment. The mode of a second modified layer 23 and a method of forming the second modified layer 23 according to a first modification will be described below.

Second Modified Layer Forming Step 3

Figure 10:
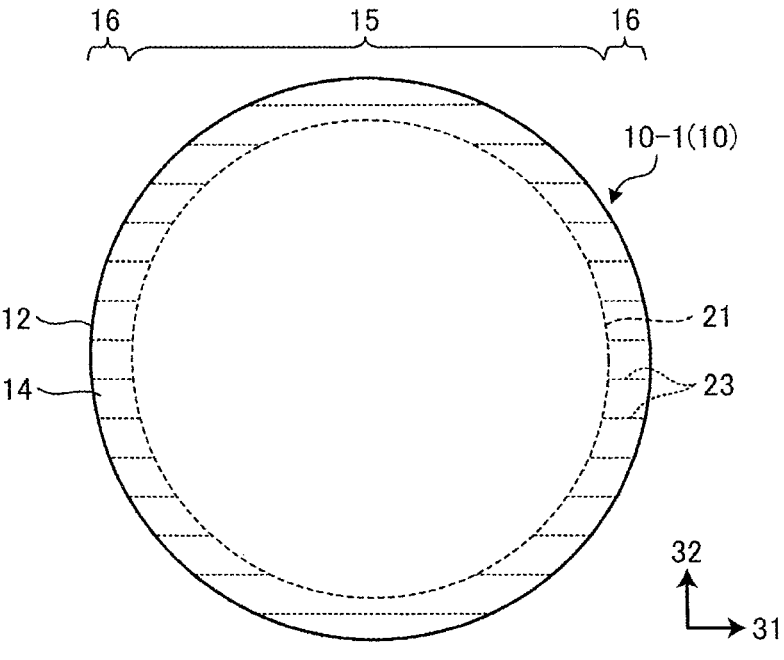
FIG. 10 is a plan view depicting the bonded wafer that has been subjected to a second modified layer forming step in a first modification.

FIG. 10 is a plan view depicting a bonded wafer 20 that has been subjected to a second modified layer forming step 3 in the first modification. The second modified layer forming step 3 in the first modification is carried out after the bonded layer forming step 1 is conducted, as in the embodiment, and may be carried out before or after the first modified layer forming step 2 is performed, or the two modified layer forming steps may be alternately carried out part by part. The second modified layer forming step 3 in the first modification is a step of forming a plurality of second modified layers 23 and a plurality of second cracks exposed on the front surface 13 side, along a first direction 31 parallel to the front surface 13 in the peripheral region 16 of the first wafer 10-1.

In the second modified layer forming step 3 in the first modification, first, the holding table 41 is rotated around a rotational axis in such a manner that the first direction 31 and a processing feeding direction of the laser processing apparatus 40 (see FIG. 5) coincide with each other. Next, while the laser beam 43 is being applied, the laser beam applying unit 42 and the holding table 41 are moved relative to each other in the processing feeding direction, whereby the second modified layer 23 along the first direction 31 is formed in the peripheral region 16.

For example, while the laser beam applying unit 42 is being moved from one end to the other end in the first direction 31 of the first wafer 10-1, the laser beam 43 is applied when the focal point 44 passes through the peripheral region 16, whereas the application of the laser beam 43 is stopped when the focal point 44 passes through the central region 15, whereby the second modified layer 23 is formed only in the peripheral region 16.

In this instance, the unillustrated second crack extends from the second modified layer 23. In the second modified layer forming step 3, the second modified layer 23 formed by irradiation with the laser beam 43 is formed in such a manner that the second crack extending from the second modified layer 23 is exposed on the front surface 13 side of the first wafer 10-1. Note that the second crack may be exposed not only on the front surface 13 side of the first wafer 10-1 but also on the back surface 14 side.

After the processing of the first wafer 10-1 from one end to the other end in the first direction 31 is finished, the laser beam applying unit 42 and the holding table 41 are moved relative to each other in an indexing feeding direction, and the second modified layer 23 along the first direction 31 is formed in a manner similar to the above. When the second modified layers 23 have been formed in the whole part of the peripheral region 16, the second modified layer forming step 3 is finished.

Second Modification

The modified layer formed in the peripheral region 16 on the peripheral edge 12 side of the first modified layer 21 is not limited to the modes of the second modified layer 22 in the embodiment and the second modified layer 23 in the first modification. The mode of a third modified layer 24 and a method of forming the third modified layer 24 according to a second modification will be described below.

Figure 11:
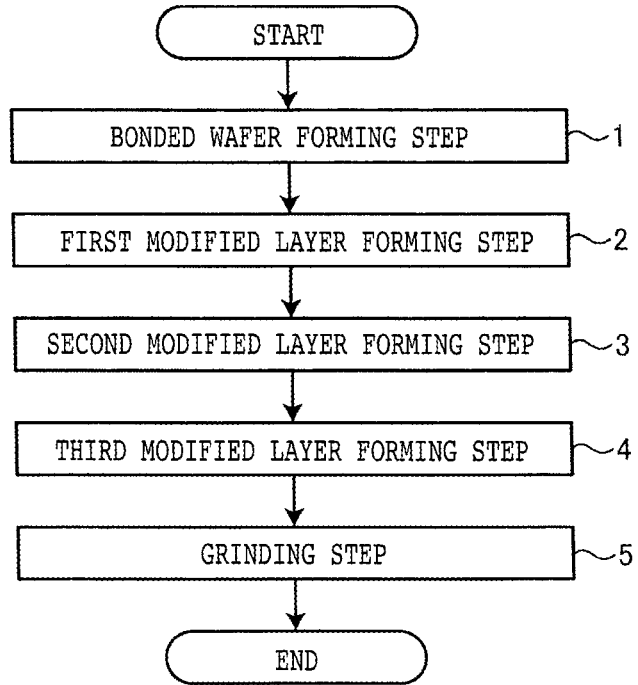
FIG. 11 is a flow chart depicting the flow of a wafer processing method according to a second modification.

FIG. 11 is a flow chart depicting the flow of a processing method for the wafer 10 according to the second modification. As depicted in FIG. 11, the processing method for the wafer 10 according to the second modification includes a bonded wafer forming step 1, a first modified layer forming step 2, a second modified layer forming step 3, a third modified layer forming step 4, and a grinding step 5. In the processing method for the wafer 10 in the second modification, the bonded wafer forming step 1, the first modified layer forming step 2, and the grinding step 5 are similar to those in the embodiment, and, hence, descriptions thereof are omitted. In addition, the second modified layer forming step 3 is similar to that in the first modification, and, hence, description thereof is omitted.

Third Modified Layer Forming Step 4

Figure 12:
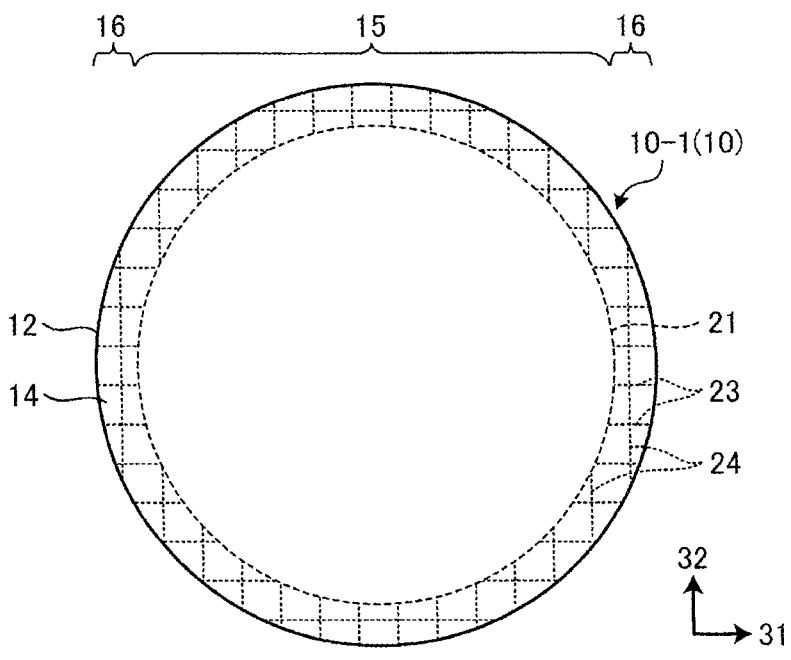
FIG. 12 is a plan view depicting a bonded wafer that has been subjected to a third modified layer forming step in the second modification.

FIG. 12 is a plan view depicting a bonded wafer 20 that has been subjected to the third modified layer forming step 4 in the second modification. The third modified layer forming step 4 is carried out after the second modified layer forming step 3 is performed but before the grinding step 5 is conducted. The third modified layer forming step 4 is a step of forming, in the peripheral region 16 of the wafer 10-1, a plurality of third modified layers 24 and a plurality of third cracks exposed on the front surface 13 side, along a second direction 32 that is parallel to the front surface 13 and that intersects the first direction 31, to thereby enlarge the warpage generated in the peripheral region 16 by the second modified layer forming step 3.

In the second modification, the second direction 32 is a direction orthogonal to the first direction 31. The method of forming the third modified layers 24 and the third cracks is a method in which the first direction 31 in the method of forming the second modified layers 23 and the second cracks in the second modified layer forming step 3 in the first modification is replaced by a second direction 32. As a result, by the second modified layers 23 and the third modified layers 24, modified layers in a grid pattern are formed in the peripheral region 16.

In the processing method for the wafer 10 in the second modification, the bonding of the first wafer 10-1 and the second wafer 10-2 to each other is canceled by the warpages generated in the peripheral region 16 by the first modified layer forming step 2, the second modified layer forming step 3, and the third modified layer forming step 4.

Third Modification

Third Modified Layer Forming Step 4

Figure 13:
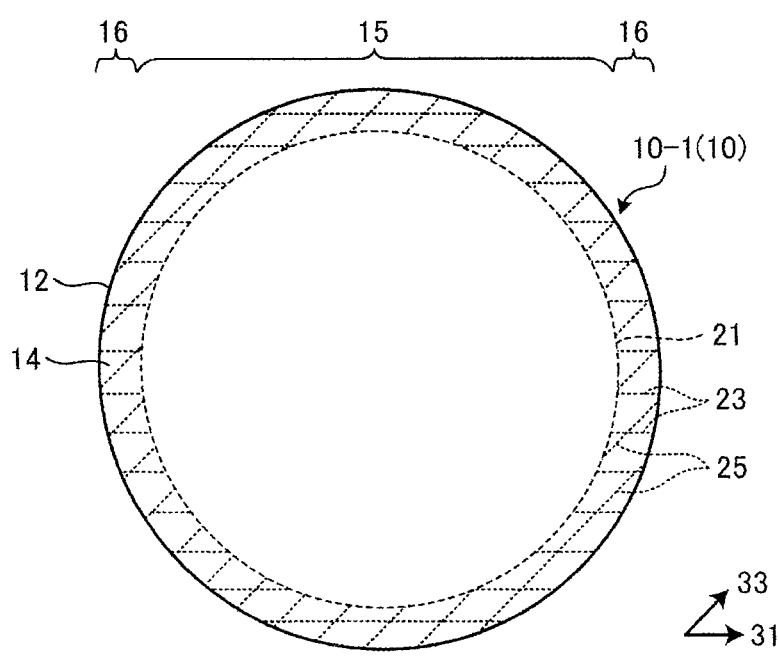
FIG. 13 is a plan view of a bonded wafer that has been subjected to a third modified layer forming step in a third modification.

FIG. 13 is a plan view depicting a bonded wafer 20 that has been subjected to a third modified layer forming step 4 in a third modification. The third modified layer forming step 4 in the third modification differs from the third modified layer forming step 4 in the second modification in the angle at which the second modified layers 23 and the third modified layers 25 intersect. In other words, as depicted in FIG. 13, in the third modification, the first direction 31 and a second direction 33 intersect each other at an angle which is greater than 0 degrees but smaller than 90 degrees.

The method of forming the third modified layers 25 and the third cracks is a method in which the second direction 32 in the method of forming the third modified layers 24 and the third cracks in the third modified layer forming step 4 in the second modification is replaced by the second direction 33. As a result, by the second modified layers 23 and the third modified layers 25, modified layers in a parallelogram grid pattern are formed in the peripheral region 16.

As has been described above, in the processing methods for the wafer 10 according to the embodiment and the modifications, after the wafers 10 are bonded with each other, the annular first modified layer 21 is formed on the inner side than the peripheral edge 12 by a predetermined distance, and the first crack 21-1 extending from the first modified layer 21 to reach the front surface 13 side (bonding surface) of the wafer 10 (the first wafer 10-1) is generated. Further, a plurality of modified layers (the second modified layers 22 and 23, the third modified layers 24 and 25) and a plurality of cracks (the second cracks 22-1, the third cracks) extending from the modified layers to reach the front surface 13 side of the first wafer 10-1 are formed in the peripheral region 16 which is the region ranging from the first modified layer 21 to the peripheral edge 12, whereby a warpage is generated in the peripheral region 16. The warping force generated in the peripheral region 16 exceeds the bonding force at the bonding surfaces, whereby the bonding of the wafers 10 to each other is canceled, and there is generated an effect that the offcuts of the peripheral region 16 are likely to be removed with the modified layer as a starting point.

Note that the present invention is not to be limited to the above-described embodiment and modifications. In other words, the present invention can be carried out with various modifications within such ranges as not to depart from the gist of the invention.

For example, before the grinding step 5 is carried out, the peripheral region 16 may be preliminarily removed by exerting an external force. Specifically, for example, a method of pressing the peripheral region 16 from above to exert an external force in a shearing direction may be adopted, a method of lifting up the peripheral region 16 to exert an external force in the shearing direction may be adopted, and a method of crushing the peripheral region 16 by a roller may be adopted. In addition, the external force is not limited to the mechanical external force. Vibration generated by ultrasonic waves may be adopted, and radial external forces generated by sticking an expandable tape to the back surface 14 of the first wafer 10-1 and expanding the expandable tape may be adopted.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method comprising:

a bonded wafer forming step of bonding a front surface side of a first wafer that is formed on the front surface side with a plurality of devices and that has its peripheral edge chamfered to a second wafer to form a bonded wafer;

a first modified layer forming step of, after the bonded wafer forming step is carried out, applying a laser beam having a wavelength transmittable through the first wafer, from a back surface side of the first wafer in an annular pattern along positions on an inner side than the peripheral edge by a predetermined distance to form in an inside of the first wafer an annular first modified layer and a first crack that extends from the first modified layer and that is exposed on the front surface side of the first wafer, thereby generating a warpage in a peripheral region on a peripheral edge side of the first modified layer and the first crack;

a second modified layer forming step of, after the bonded wafer forming step is carried out, applying the laser beam having the wavelength transmittable through the first wafer, to the peripheral region in an annular pattern, to form in the inside of the first wafer a plurality of annular second modified layers and a plurality of second cracks that extend from the second modified layers and that are exposed on the front surface side of the first wafer, thereby generating a warpage in the peripheral region; and a grinding step of, after the first modified layer forming step and the second modified layer forming step are carried out, grinding the first wafer of the bonded wafer from the back surface side to thin the first wafer to a finished thickness, wherein the bonding of the first wafer and the second wafer to each other is canceled by the warpages generated in the peripheral region in the first modified layer forming step and the second modified layer forming step.

2. A wafer processing method comprising:

a bonded wafer forming step of bonding a front surface side of a first wafer that is formed on the front surface side with a plurality of devices and that has its peripheral edge chamfered to a second wafer to form a bonded wafer;

a first modified layer forming step of, after the bonded wafer forming step is carried out, applying a laser beam having a wavelength transmittable through the first wafer, from a back surface side of the first wafer in an annular pattern along positions on an inner side than the peripheral edge by a predetermined distance to form in an inside of the first wafer an annular first modified layer and a first crack that extends from the first modified layer and that is exposed on the front surface side of the first wafer, thereby generating a warpage in a peripheral region on a peripheral edge side of the first modified layer and the first crack;

a second modified layer forming step of, after the bonded wafer forming step is carried out, applying the laser beam having the wavelength transmittable through the first wafer, to the peripheral region along a first direction parallel to the front surface of the first wafer, to form in the inside of the first wafer a plurality of second modified layers and a plurality of second cracks that extend from the second modified layers and that are exposed on the front surface side of the first wafer, thereby generating a warpage in the peripheral region; and a grinding step of, after the first modified layer forming step and the second modified layer forming step are carried out, grinding the first wafer of the bonded wafer from the back surface side to thin the first wafer to a finished thickness, wherein the bonding of the first wafer and the second wafer to each other is canceled by the warpages generated in the peripheral region in the first modified layer forming step and the second modified layer forming step.

3. The wafer processing method according to claim 2, further comprising:

a third modified layer forming step of, after the second modified layer forming step is carried out but before the grinding step is carried out, applying the laser beam having the wavelength transmittable through the first wafer, to the peripheral region along a second direction that is parallel to the front surface of the first wafer and that intersects the first direction, to form in the inside of the first wafer a plurality of third modified layers and a plurality of third cracks that extend from the third modified layers and that are exposed on the front surface side of the first wafer, thereby enlarging the warpage generated in the peripheral region in the second layer forming step, wherein the bonding of the first wafer and the second wafer to each other is canceled by the warpages generated in the peripheral region in the first modified layer forming step, the second modified layer forming step, and the third modified layer forming step.

4. The wafer processing method according to claim 3, wherein the first direction and the second direction intersect each other at an angle greater than 0 degrees but smaller than 90 degrees.

\* \* \* \* \*